(12) United States Patent
Wang et al.

(10) Patent No.: US 7,463,484 B2
(45) Date of Patent: Dec. 9, 2008

(54) HEATSINK APPARATUS

(75) Inventors: Feng-Ku Wang, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 5 days.

(21) Appl. No.: 11/702,112

(22) Filed: Feb. 5, 2007

(65) Prior Publication Data

US 2008/0186675 A1 Aug. 7, 2008

(51) Int. Cl.
*H05K 7/20* (2006.01)
*H01L 23/34* (2006.01)
*F28F 7/00* (2006.01)

(52) U.S. Cl. ............... 361/695; 165/80.2; 165/185; 165/121; 257/722; 361/704; 361/703; 361/694

(58) Field of Classification Search ........... 257/722; 361/703

See application file for complete search history.

(56) References Cited

U.S. PATENT DOCUMENTS

| | | | | | |
|---|---|---|---|---|---|
| 3,706,127 | A | * | 12/1972 | Oktay et al. ............ | 438/3 |
| 5,107,330 | A | * | 4/1992 | Dahringer ............ | 257/718 |
| 5,299,090 | A | * | 3/1994 | Brady et al. ............ | 361/703 |
| 5,358,032 | A | * | 10/1994 | Arai et al. ............ | 165/80.3 |
| 5,390,734 | A | * | 2/1995 | Voorhes et al. ............ | 165/185 |
| 5,898,570 | A | * | 4/1999 | Koon et al. ............ | 361/704 |
| 6,223,814 | B1 | * | 5/2001 | Moresco et al. ............ | 165/185 |
| 6,289,975 | B2 | * | 9/2001 | Kuo ............ | 165/80.3 |
| 6,301,779 | B1 | * | 10/2001 | Azar ............ | 29/890.03 |
| 6,883,592 | B2 | * | 4/2005 | Lee ............ | 165/80.3 |
| 6,958,915 | B2 | * | 10/2005 | Wang et al. ............ | 361/709 |
| 7,046,515 | B1 | * | 5/2006 | Wyatt et al. ............ | 361/697 |

* cited by examiner

*Primary Examiner*—Gregory D Thompson
(74) *Attorney, Agent, or Firm*—Rabin & Berdo, P.C.

(57) ABSTRACT

A heatsink apparatus for dissipating heat generated by electronic parts is provided. The heatsink apparatus includes a fan and a heatsink fin. One end of the heatsink fin is adhered to an electronic component, the other end forms a curl portion, and a curl inner surface receives an air flow generated by the fan, so as to quickly dissipate the heat energy of the electronic component.

13 Claims, 6 Drawing Sheets

HEATSINK APPARATUS

BACKGROUND OF THE INVENTION

1. Field of Invention

The present invention relates to a heatsink apparatus. More particularly, the present invention relates to a heatsink apparatus with a large heat-dissipation area.

2. Related Art

Along with the quick development and expansion of the application scope of high-tech industry, such as electronic information, portable computers have been increasingly popularized. The operating speed of electronic components, such as central processing units (CPU), hard disk drives (HDD) inside the portable computer apparatuses, increasingly becomes high, and the electronic components are miniaturized, so the heat-generating volume of a unit area is increased. If the heat cannot be dissipated in time, the overhigh temperature may seriously affect the stability and operating efficiency of the electronic components.

In order to effectively dissipate the heat generated by the electronic components, heatsink modules are installed in the computer apparatus to dissipate heat and reduce the working temperature of the computer apparatus. As shown in FIGS. 1A and 1B, according to a heat-dissipation method for electronic components in a portable computer of the conventional art, a heat conductive plate 10 is adhered to the electronic component 20 that generates heat, so as to increase the total dissipation area of the electronic component 20. The heat conductive plate 10 is extended to the position of a fan 11 away from the electronic component 20, so as to conduct a part of heat generated by the electronic component 20 to the fan 11 to dissipate heat through a convection forced by the fan 11. In addition, in order to improve the heat-dissipation performance of the fan 11, a heatsink fin 12 is further disposed on the fan 11. The heat conductive plate 10 is extended to and is connected with the heatsink fin 12, so as to accelerate the dissipation of heat.

In the conventional heat-dissipation method, the effective heat-dissipation area of the heat conductive plate for dissipating heat by using the forced convection is the surface above the fan only, and the area of a direct air receiving surface of the heat conductive plate is equal to that of the fan vent at most, such that the heat-dissipation area is limited and cannot achieve the effects of quick and uniform dissipation. In order to improve the dissipation performance, a heat conductive plate with larger area must be used. However, the heat conductive plate with larger area may cause an increase of the heat-dissipation resistance of the heat conductive plate. As such, as for the heatsink module, it is necessary to improve the flowing speed of the cooling air, reduce the temperature of the cooling air, or add more heat conductive plates, so as to alleviate the problem of the increase of thermal resistance. However, the problems of the increase of cost, big noise of fan, and complex arrangement of the entire system are generated.

In the conventional heat-dissipation method of FIG. 1B, the heat conductive plate and the heatsink fin must be connected by a bonding method, such as adhering or welding, so the manufacturing flow becomes more complex due to the step of bonding the heat conductive plate and the heatsink fin. The heatsink fin can only provide additional heat-dissipating contact area, and cannot facilitate the flowing and conducting of the air flow, and the disposal of the heatsink fin occupies too much space. In addition, as the heat conductive plate and the heatsink fin are not integrated into one piece, the junction therebetween is not completely sealed. The contact area is quite limited, such that the total effect of heat-dissipation is poor.

SUMMARY OF THE INVENTION

In view of the above problems, the present invention provides a heatsink apparatus, thereby eliminating the limitations or disadvantages of small heat-dissipation area of the heat conductive plate, poor heat-dissipation performance, and too much space volume occupied by the heatsink fin existing in the prior art.

The heatsink apparatus disclosed by the present invention is used to dissipate the heat generated by an electronic component in an electronic apparatus. The heatsink apparatus has a fan for generating an air flow and a heatsink fin. One end of the heatsink fin is adhered to the electronic component, and the other end is bended to form a curl portion. The curl portion is formed by a plurality of continuous inner surfaces. The inner surfaces have intervals in-between and are overlapped with one another. The air flow generated by the fan is conducted to at least one curl inner surface of the curl portion, and the winding axial direction of the curl portion is parallel to the air flow direction of the fan, so as to quickly dissipate the heat of the electronic component conducted to the curl portion.

The present invention is featured in that one end of the heatsink fin is wound to form a continuous bended curl portion, and the curl portion is correspondingly disposed at the vent of the air flow. The curl inner surfaces arranged with intervals in-between of the curl portion receives the convection air flow generated by the fan, so as to greatly increase the contact area between the heatsink fin and the convection air flow, and quickly dissipate the heat of the electronic component conducted to the curl portion.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The heatsink apparatus disclosed by the present invention is applicable to the electronic component of the electronic apparatus. The electronic apparatus includes, but is not limited to, computer equipments, such as personal computers and notebook computers. In the following detailed description of the present invention, the electronic component disposed in the notebook computer is illustrated as a preferred embodiment of the present invention. However, the accompanying drawings are provided for reference and illustration, and are not intended to limit the present invention.

Figure 1A:
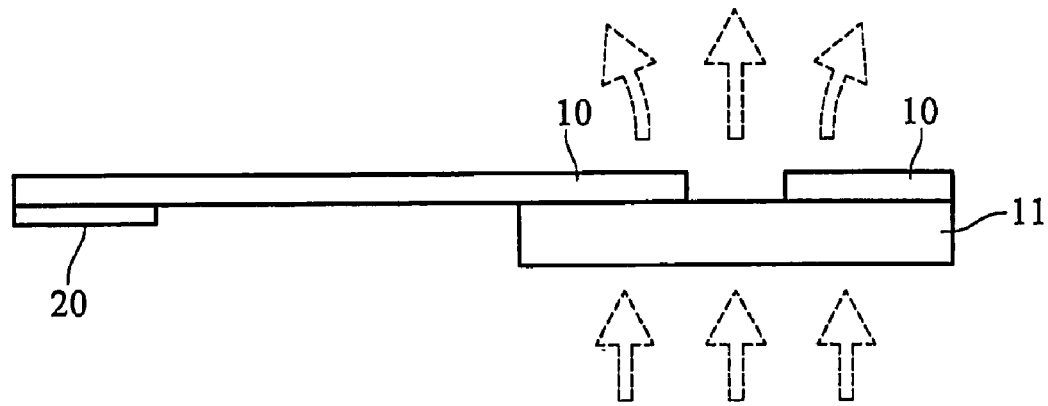
FIG. 1A is a side view of the conventional art.
Figure 1B:
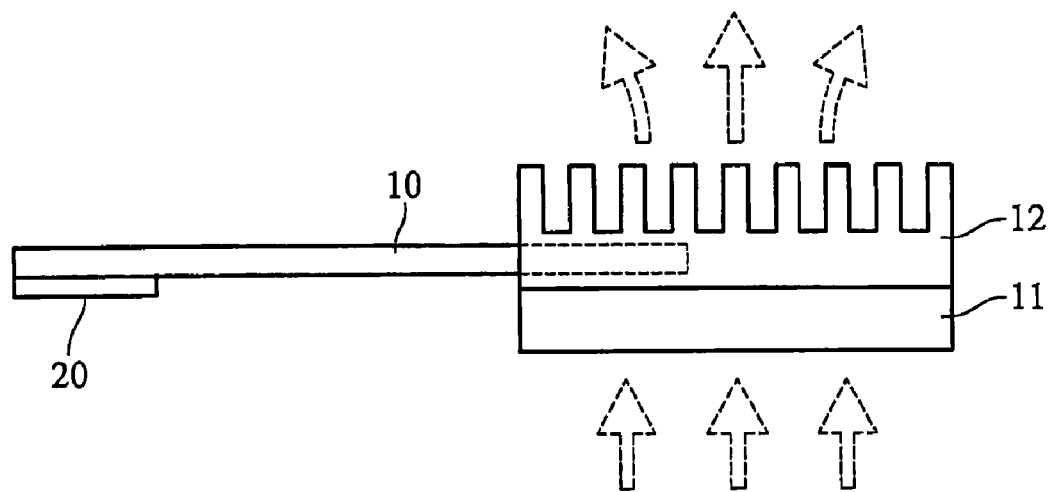
FIG. 1B is an another side view of the conventional art.
Figure 2:
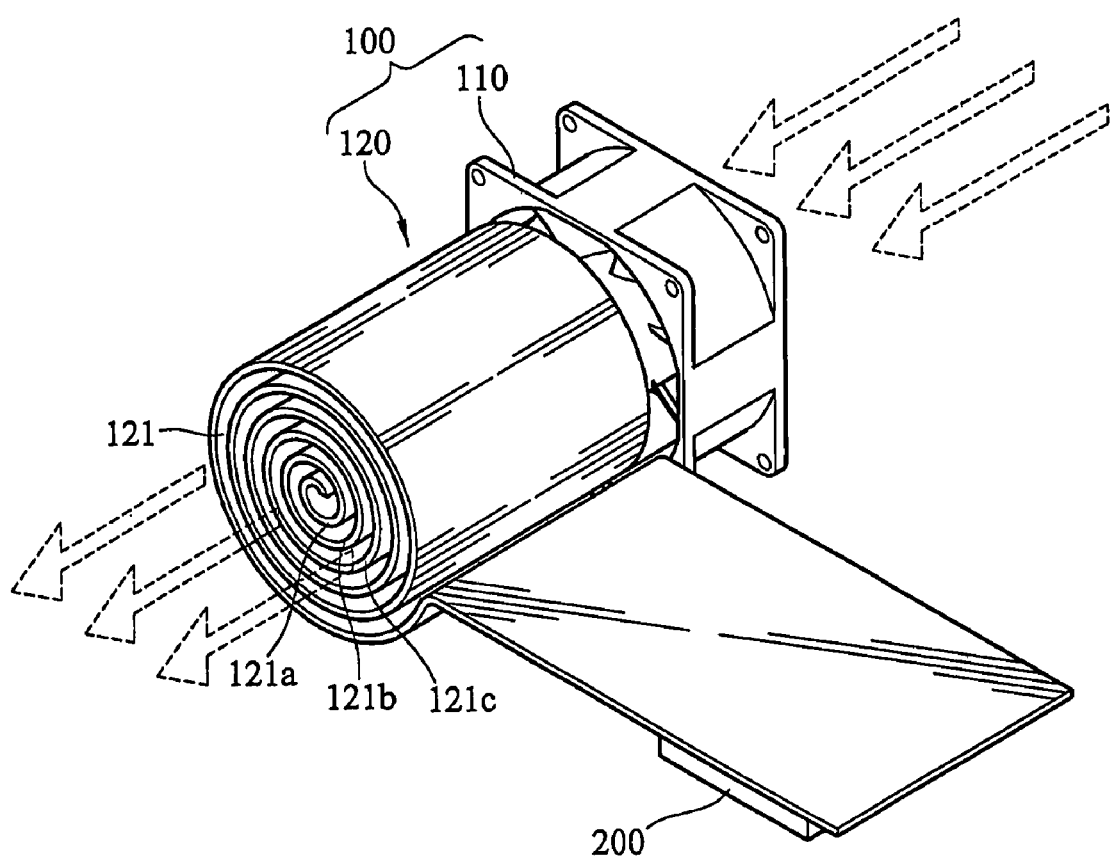
FIG. 2 is a schematic isometric view of a first embodiment of the present invention.

FIG. 2 is a schematic isometric view of a first embodiment of the present invention. As shown in the figure, the heatsink apparatus 100 of the present invention is used to dissipate the heat generated by the electronic component 200 in the electronic apparatus, and the electronic component 200, such as a chip and a processor, generates high heat energy during operating. The heatsink apparatus 100 disclosed by the present invention includes a fan 110 and a heatsink fin 120. The fan 110 is used to generate a convection air flow and dissipate the heat by forced convection. One end of the heatsink fin 120 is adhered to a surface of the electronic component 200, and the other end is bended to form a curl portion 121. Therefore, the heat generated by the electronic component 200 is conducted to the curl portion 121 of the other end via one end adhered to the heatsink fin 120. The position where the curl portion 121 is installed corresponds to the vent of the fan 110. The convection air flow blown by the fan 110 is guided to the curl inner surfaces 121a, 121b, and 121c in the curl portion 121, so as to dissipate the heat of the electronic component 200 conducted to the curl portion 121. The material of the heatsink fin 120 includes, but is not limited to, metal materials with high heat conductive coefficient, such as silver or silver alloy, copper or copper alloy, so as to quickly conduct and dissipate the heat of the electronic component 200.

Referring to FIG. 2, the curl portion 121 of the heatsink fin 120 is formed by a plurality of continuous inner surfaces 121a, 121b, and 121c which are connected together. The inner surfaces 121a, 121b, and 121c have intervals in-between and are overlapped with one another. In this embodiment, the curl portion 121 is a spiral curl portion, i.e., the winding starts from a short edge of the heatsink fin 120 of FIG. 2, and a heatsink surface of the heatsink fin 120 is wound along the same direction. An interval exists between the circles in the curl portion 121, and one circle do not contact another, so as to form a hollow spiral cylinder structure. The fan 110 of the first embodiment of the present invention is an axial flow fan, and the generated air flow is directly blown out in a direction parallel to the axial direction of the fan. The curl portion 121 is disposed at the axial vent of the axial flow fan 110, and the winding axial direction of the curl portion 121 is parallel to the direction of the air flow from the fan 110. Therefore, the curl inner surfaces 121a, 121b, and 121c arranged with intervals in the curl portion 121 may receive the air flow generated by the axial flow fan 110, and the air flow may pass through the hollow part of the curl portion 121, and contacts with the head sink surface of the curl portion 121 to the maximum extent, so as to quickly dissipate the heat of the electronic component 200 conducted to the curl portion 121.

Figure 3:
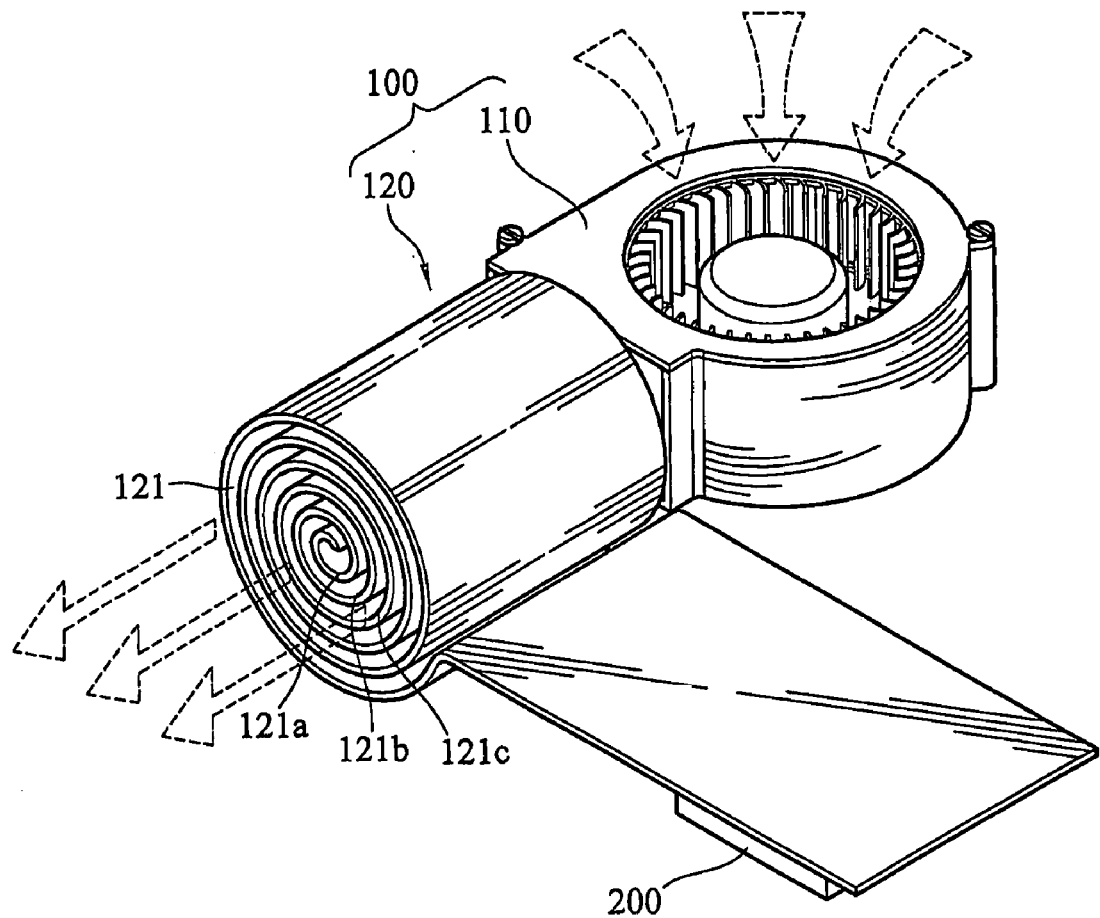
FIG. 3 is a schematic isometric view of a second embodiment of the present invention.

FIG. 3 is a schematic isometric view of a second embodiment of the present invention. The fan 110 disclosed by the present invention may be a side flow fan, and the vent is disposed at the side position. The air flow firstly passes through blades of the fan, and then is blown out through the vent perpendicular to the blade. The curl portion 121 is disposed with its winding axial direction parallel to the side vent of the side flow fan 110, such that the curl inner surfaces 121a, 121b, and 121c in the curl portion 121 can completely receive the air flow generated by the fan 110. The air flow passes through the hollow portion of the curl portion 121, and contacts with the heatsink surface of the curl portion 121 to the maximum extent, so as to quickly dissipate the heat of the electronic component 200 conducted to the curl portion 121.

Figure 4:
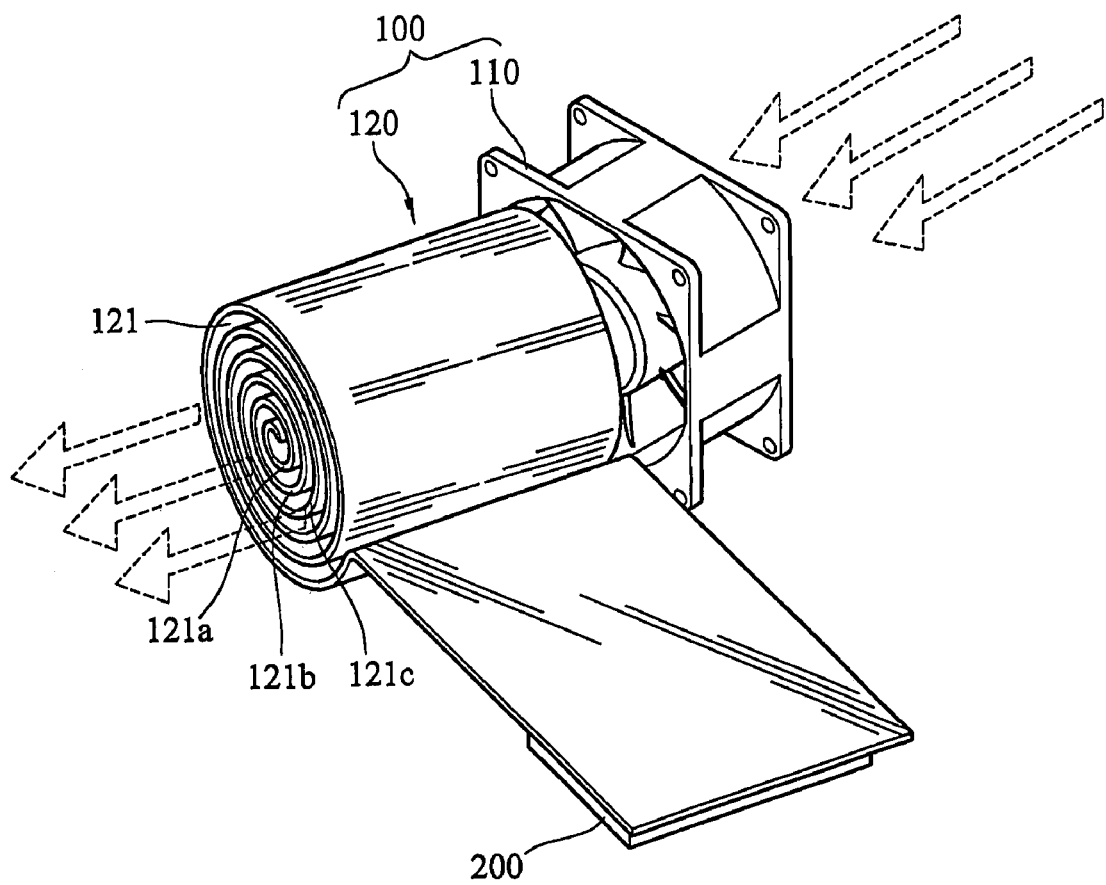
FIG. 4 is a schematic isometric view of the curl portion of a heatsink fin forming an inclined angle with a fan of the present invention.
Figure 5A:
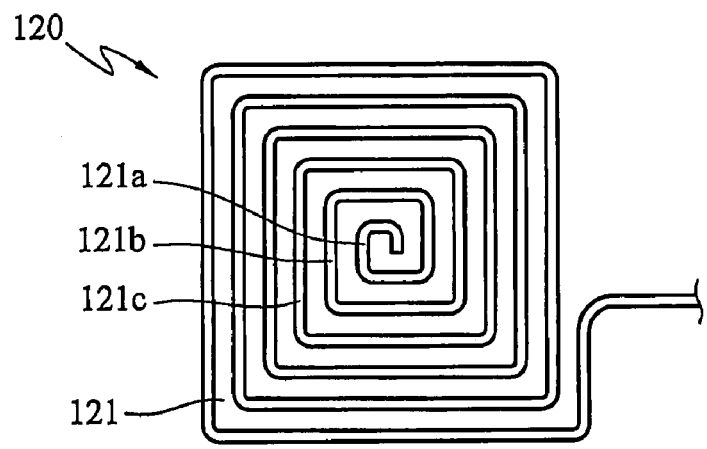
FIG. 5A is a schematic sectional view of the curl portion of a different aspect of the present invention.
Figure 5B:
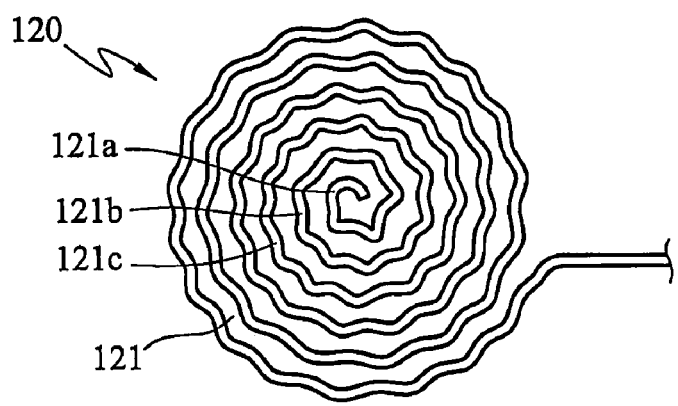
FIG. 5B is a schematic sectional view of the curl portion of a different aspect of the present invention.
Figure 5C:
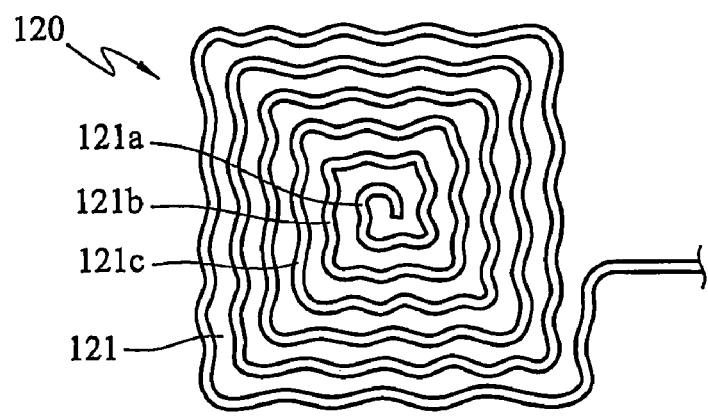
FIG. 5C is a schematic sectional view of the curl portion of a different aspect of the present invention.
Figure 5D:
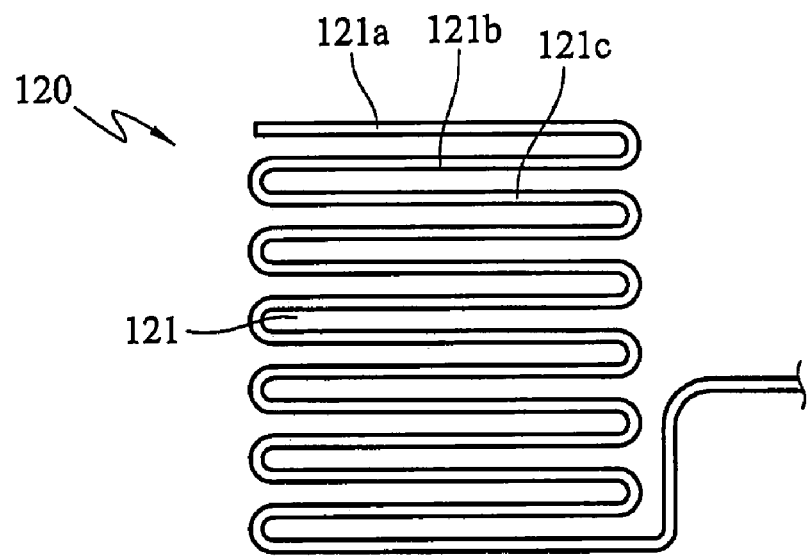
FIG. 5D is a schematic sectional view of the curl portion of a different aspect of the present invention.
Figure 5E:
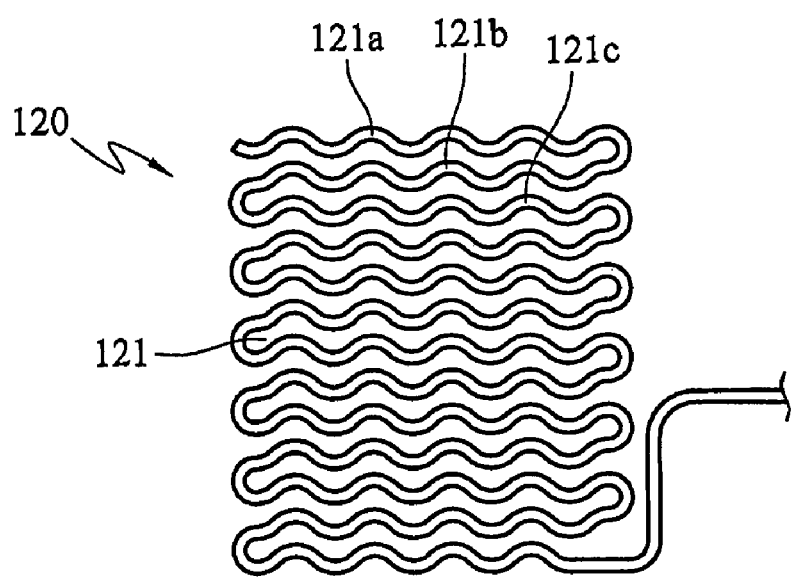
FIG. 5E is a schematic sectional view of the curl portion of a different aspect of the present invention.

Referring to FIG. 4, according to the practical requirements on the circuit board configuration in the electronic apparatus, the curl portion 121 of the present invention forms an inclined angle with respect to the vent of the fan 110, and is disposed in accordance with the disposal of circuit board, so as to make full use of the space. The inclined angle between the curl portion 121 and the fan is less than 70°, such that the curl inner surfaces 121a, 121b, and 121c of the curl portion 121 are still located at the vent so as to successively receive the air flow blown by the fan 110 and dissipate the heat generated by the electronic component 200.

FIGS. 5A to 5E are schematic sectional views of the curl portion of different aspect of the present invention. As shown in the figure, the curl portion 121 disclosed by the present invention is a round spiral structure, and can also be wound to a round corrugated spiral structure, a square spiral structure, a square corrugated spiral structure, or a straight turn back structure, a straight corrugated turn back structure, etc. to form the curl portion 121 with a plurality of heatsink surfaces arranged with intervals, so as to increase the contact area between the curl portion 121 and the air flow. However, those skilled in the art can bend the curl portion 121 into different forms, which are not limited to the embodiments disclosed by the present invention. The curl portion 121 of different aspects is not limited to be applied to the axial flow fan or the side flow fan.

In addition, in order to make the curl inner surfaces 121a, 121b, and 121c in the curl portion 121 completely receive the air flow of the fan (not shown), the curl portion 121 of different aspects disclosed by the present invention is correspondingly disposed at the vent with its winding axial direction parallel to the direction of the air flow of the fan (not shown), so as to improve the overall heat-dissipation performance of the curl portion 121.

One end of the heatsink fin disclosed by the present invention is wound to form a continuous bended curl portion, such that the curl inner surfaces of the curl portion contact with the convection air flow of the fan to the maximum extent, and the long axial direction of the curl portion is parallel to the direction of the air flow blown by the fan, such that the curl portion completely receives the convection air flow generated by the fan. Therefore, the heat generated by the electronic component in the electronic apparatus may be quickly dissipated by the heatsink fin arranged with intervals, so as to provide a good heat-dissipation performance in the limited space inside the electronic apparatus.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink apparatus, for dissipating heat generated by an electronic component of an electronic apparatus, comprising:

a fan, for generating an air flow; and a heatsink fin, having two ends, one end of the heatsink fin formed of a curl portion overlappingly bent with an interval so as to form a plurality of continuous curl inner surfaces, each continuous curl inner surface spaced apart from each other with an interval, the other end extending from the curl portion and adhered to the electronic component by an end surface, so as to conduct the heat generated from the electronic component to the curl portion, wherein the curl inner surface of the curl portion receives the air flow of the fan, so as to dissipate the heat.

2. The heatsink apparatus as claimed in claim 1, wherein a winding axial direction of the curl portion is parallel to a flowing direction of the air flow of the fan.

3. The heatsink apparatus as claimed in claim 2, wherein the winding axial direction of the curl portion forms an angle with the flowing direction of the air flow of the fan.

4. The heatsink apparatus as claimed in claim 3, wherein the winding axial direction forms an angle less than 70° with respect to the flowing direction of the air flow of the fan.

5. The heatsink apparatus as claimed in claim 1, wherein the curl portion is a spiral structure.

6. The heatsink apparatus as claimed in claim 5, wherein the curl portion is a round spiral structure.

7. The heatsink apparatus as claimed in claim 5, wherein the curl portion is a square spiral structure.

8. The heatsink apparatus as claimed in claim 5, wherein the curl portion is a corrugated spiral structure.

9. The heatsink apparatus as claimed in claim 1, wherein the curl portion is a turn back structure.

10. The heatsink apparatus as claimed in claim 9, wherein the curl portion is a straight turn back structure.

11. The heatsink apparatus as claimed in claim 9, wherein the curl portion is a corrugated turn back structure.

12. The heatsink apparatus as claimed in claim 1, wherein the fan is an axial flow fan, the curl portion is disposed at an axial vent of the axial flow fan, so as to receive the air flow of the fan.

13. The heatsink apparatus as claimed in claim 1, wherein the fan is a side flow fan, the curl portion is disposed at a side vent of the side flow fan, so as to receive the air flow of the fan.

* * * * *